US00RE35750E

United States Patent [19]

Casper et al.

[11] E Patent Number: Re. 35,750

[45] Reissued Date of Patent: Mar. 24, 1998

[54] WORDLINE DRIVER CIRCUIT HAVING AN AUTOMATIC PRECHARGE CIRCUIT

[75] Inventors: Stephen L. Casper, Boise, Id.; Adrian Ong, San Jose, Calif.; Paul S. Zagar, Boise, Id.

[73] Assignee: Micron Technology, Inc., Boise, Id.

[21] Appl. No.: 611,618

[22] Filed: Mar. 8, 1996

Related U.S. Patent Documents

Reissue of:

[64] Patent No.: 5,293,342
Issued: Mar. 8, 1994
Appl. No.: 993,929
Filed: Dec. 17, 1992

[51] Int. Cl.[6] ..... G11C 7/00

[52] U.S. Cl. ..... 365/203; 365/230.06

[58] Field of Search ..... 365/203, 230.06, 365/189.09, 189.11

[56] References Cited

U.S. PATENT DOCUMENTS

| | | | |
|---|---|---|---|
| 4,811,304 | 3/1989 | Matsuda | 365/230.06 |
| 4,899,315 | 2/1990 | Houston | 365/230.06 |
| 4,962,327 | 10/1990 | Iwazaki | 365/230.06 |
| 5,054,002 | 10/1991 | Ninomiya | 365/233 |
| 5,065,361 | 11/1991 | Yoshizawa | 365/104 |
| 5,202,855 | 4/1993 | Morton | 365/226 |

FOREIGN PATENT DOCUMENTS

| | | |
|---|---|---|
| 62-20200 | 1/1987 | Japan . |

*Primary Examiner*—A. Zarabian
*Attorney, Agent, or Firm*—Trask, Britt & Rossa

[57] ABSTRACT

The invention is an automatic precharge circuit featuring precharge devices each of which is interposed between a high voltage node, connectable to a supply potential, and a serial node. The precharge devices are gated automatically by a primary predecode signal of a decode portion of the row decoder. Power is conserved since the serial nodes are passively pulled to the supply potential through the precharge devices. The invention increases speed and provides error free wordline selection.

34 Claims, 7 Drawing Sheets

WORDLINE DRIVER CIRCUIT HAVING AN AUTOMATIC PRECHARGE CIRCUIT

Matter enclosed in heavy brackets [ ] appears in the original patent but forms no part of this reissue specification; matter printed in italics indicates the additions made by reissue.

CROSS REFERENCE TO RELATED APPLICATIONS

This application is being filed simultaneously with copending application having disclosure number 92-084.1 entitled A WORDLINE DRIVER CIRCUIT HAVING A DIRECTLY GATED PULL-DOWN DEVICE.

TECHNICAL FIELD

This invention relates generally to memory device technologies and more particularly to a circuit and method for driving a wordline to a desired potential.

BACKGROUND OF THE INVENTION

A DRAM consists of an arrangement of individual memory cells. Each memory cell comprises a capacitor capable of holding a charge and a field effect transistor, hereinafter referred to as an access transistor, for accessing the capacitor charge. The charge is referred to as a data bit and can be either a high voltage or a low voltage. Therefore, the memory has two states; often thought of as the true logic state and the complementary logic state. There are two options available in a DRAM memory: a bit of data may be stored in a specific cell in the write mode, or a bit of data may be retrieved from a specific cell in the read mode. The data is transmitted on signal lines, also called digit lines, to and from the Input/Output lines, hereinafter known as I/O lines, through field effect transistors used as switching devices and called decode transistors. For each bit of data stored, its true logic state is available at an I/O line and its complementary logic state is available at a line designated I/O*. For purposes of this discussion, I/O and I/O* lines are often referred to as just I/O lines. Thus, each cell has two digit lines, referred to as digit line pairs.

Typically, the memory cells are arranged in an array and each cell has an address identifying its location in the array. The array comprises a configuration of intersecting rows and columns and a memory cell is associated with each intersection. In order to read from or write to a cell, the particular cell in question must be selected, also called addressed. The address for the selected cell is represented by input signals to a row decoder and to a column decoder. The row decoder activates a wordline in response to the row address. The selected wordline activates the access transistor for each of the memory cells in electrical communication with the selected wordline. Next the column decoder activates a column decoder output in response to the column address. The active column decoder output selects the desired digit line pair. For a read operation the selected wordline activates the access transistors for a given row address, and data is latched to the digit line pairs. The column decoder output selects and activates the decode transistors such that the data is transferred from the selected digit line pair to the I/O lines.

The row decoder comprises decode circuitry for determining which wordline selected for a desired address and for determining which wordlines are non-selected. The row decoder also comprises driver circuitry for driving the selected and the non-selected wordlines to potentials having active and inactive logic states respectively. The active wordline has a potential capable of activating the access transistors in electrical communication with the active wordline and the inactive wordline has a potential capable of deactivating the access transistors in electrical communication with the non-selected wordlines. For this discussion the selected wordline will have a high potential and the non-selected wordlines will have low potentials.

Typically the decode circuitry comprises a primary decoder and a secondary decoder for generating a primary select signal, $S_1$*, and a least one secondary select signal, $S_2$, respectively. The asterisk indicates that the signal is active low. The primary and secondary select signals are used as inputs to a driver portion of the row decoder. The driver portion typically comprises an inverter portion and a latch portion. The primary select signal is typically inverted to the wordline by the inverter porton, and the secondary select signal regulates the switching of the primary select signal to the inverter portion. The latch portion latches a non-selected wordline to the inactive logic state.

Typical decoder circuitries can comprise either MOS decodes utilizing NAND circuitry or NOR circuitry, or tree decode circuitry. FIGS. 1, 2 and 3 are examples of a portion of the NAND, NOR, and tree decode circuitries respectively. The decode circuitries of the row decoder provide predecoded addresses to select the driver portion of the row decoder circuit MOS decode circuitry provides predecode signals comprising the primary select signal, $S_1$*, and the secondary sheet signal, $S_2$. Although the specific decode circuitry determining the values of $S_1$* and $S_2$ can vary, the variations are well known in the art. FIGS. 1–3 have been included to provide examples of portions of possible decode circuitries. FIG. 1 is an example of a portion of a CMOS NAND decode circuit wherein each of the secondary select signals, $S_{2A}$, $S_{2B}$, $S_{2C}$ and $S_{2D}$, is a one of four decode having four phase, and wherein $S_1$* (not shown) comes from a one of 64 CMOS NAND decode used to decode 256 wordlines. FIG. 2 is an example of a portion of a CMOS NOR decode circuit wherein each of the primary select signals, $S_{1A}$*, $S_{1B}$*, $S_{1C}$* and $S_{1D}$*, is a one of four decode using four phases, and wherein secondary select signal $S_2$, (not shown), comes from a one of 64 CMOS NOR decode used to decode 256 wordlines.

In the circuits of FIGS. 1 and 2, the secondary select signal controls the activation of a single pass transistor. The decode circuitry may employ the tree decode configuration wherein a plurality of serially connected pass transistors are activated in order to drive the selected wordline to a high logic level. In the example depicted by FIG. 3 predecode address signals activate three serially connected pass transistor. For example if predetermined address signals RA56(0), RA34(0), and RA12(1) are high and the remaining predecode addresses are low, transistors 1,2, and 3 are activated providing an electrical path between points 4 and 5. These decode circuitries are well known to those skilled in the art.

FIG. 4 is a simplified schematic of the driver circuit of the related art. Each wordline in the array has a similar driver circuit. In FIG. 4, a MOS decode has been utilized to provide a primary select signal $S_1$* at primary select node 4 and a secondary select signal $S_2$ at secondary select node 6. The select signals $S_1$* and $S_2$ control the potential of the wordline 8. The primary select signal is transmitted through NMOS transistor 9 and continually gated transistor 10 to an inverter/latch portion 11 when the secondary select signal is high. When select signal $S_2$ is high, NMOS transistor 9 activates and the select signal on $S_1$* is inverted to the wordline 8.

FIG. 5 is a simplified schematic of a portion of the decode circuitry of a typical row decoder of the related art. Primary select signals $S_1$* and $S_1$'* and secondary select signals $S_2$ and $S_2$' are generated by decode circuitry (not shown). The purpose of this discussion is to provide an understanding of the final mechanism for activating and deactivating the wordlines and to provide an understanding of the relationship between the select signal and the driver circuit. At the onset of each read or write cycle, all of the wordlines are typically reset to a low potential. In this case, select signals $S_1$*, $S_1$'*, $S_2$, and $S_2$' have a high potential which take the potentials of the wordlines 12, 14, 16, and 18 low.

During the selection of a wordline the secondary select signals go low except for the secondary select signal which activates the pass transistor in electrical communication with the selected wordline. All of the primary select signals remain high except for the primary select signal which must be inverted to the selected wordline.

Still referring to FIG. 5, assume the desired address selects wordline 14. In this case select signal $S_2$ goes low and select signal $S_2$' is high; and select signal $S_1$'* goes low, and select signals $S_1$* is high. The low select signal $S_1$'* is inverted to wordline 14 through activated transistor 22. Although transistors 21 and 23 are deactivated the wordlines 12 and 16 remain at the initial low potential due to a latching of the low potential by the inverter/latch portion 11 of the driver circuits. Wordline 18 is driven low when the high potential of $S_1$* is driven through activated transistor 24 and inverted to wordline 18.

FIG. 6 is exemplary of a driver portion of a row decoder circuit wherein the decode portion is implemented with tree decode circuitry having a plurality of pass transistors 25.

Serial nodes 26 and 27 tend to float to unknown potentials between cycles of cell selection. Since it is important to know the potential of serial nodes 26 and 27 the serial nodes 26 and 27 are typically reset to a known potential prior to the selection of the active wordline. During reset transistors 25 are actuated thereby precharging the serial nodes 26 and 27 to a high potential. Initial precharging presents a problem since there is a significant power consumption associated with precharging all of the serial nodes at the onset of each cycle.

In some circuits there have been problems with latch up. Latch up occurs when node 40 in FIGS. 4 and 6 has latched to the high supply potential through a transistor component (not shown) of the driver circuit. Latch up occurs when the potential of node 40 is greater than the supply potential, $V_{ccp}$. This can occur during power up when the supply potential is increasing. In order to eliminate latch up, a transistor device 10 is continually gated by a $V_{ccp}$ supply potential as shown in FIGS. 4 and 6. Transistor device 10 keeps the potential at node 40 less than the supply potential as long as the potentials at nodes 42 and 27 are less than the supply potential. Therefore, as long as the potentials at nodes 42 and 27 are less than $V_{ccp}$, the part will not latch up since the n-well of the transistor component of the driver circuit will never be forward biased. The function of the continually gated device will become clear when analyzed with respect to subsequent schematics of the present invention.

$V_{ccp}$ is a high voltage pump potential typically equal to the supply potential, $V_{cc}$, of the memory device plus a threshold voltage, $V_t$, of the access transistor, $V_{cc}+V_t$ equals $V_{ccp}$. The threshold voltage of the access transistor is the potential that must be overcome in order for the access transistor to conduct current.

In order to conserve power, supply potentials of many memory devices have been decreased from the typical 5 volt $V_{cc}$. A low supply voltage of 3.3 volts is increasingly replacing the 5 volt operation. There is a disadvantage associated with the lower supply potentials. Often the potentials driven to a node are marginal. They often do not meet the minimum low potentials for a high logic state. Thus, circuits can experience erroneous outputs potentials. For example, in FIG. 6 when the supply voltage is approximately 3 volts, the select signal on $S_1$* may be 3 volts. Considering that the NMOS transistor doesn't pass high potentials with minimal loss, we must expect a threshold voltage drop across the NMOS transistors 25. The input voltage to the inverter/latch 11, FIGS. 4–6, may drop from 3 volts to 2 volts due to the threshold loss. There exists the increased probability that the inverter/latch 11 will see the 2 volts as a low logic state rather than the high logic state desired, or that the threshold voltage loss will be greater thereby decreasing the potential at the input of the inverter/latch. A need therefore exists to provide a row decoder that consistently drives the wordline to the inactive low state for a high primary select signal regardless; of the supply potential used. Therefore, memory device circuits need to be redesigned in order to successfully drive wordlines to low logic levels for circuits utilizing supply potentials less than the typical 5 volts.

Further understanding of the DRAM circuitry can be gleaned from the DRAM DATA BOOK, 1992, published by Micron Technology and herein incorporated by reference.

SUMMARY OF THE INVENTION

An object of the invention is to conserve power, increase speed, and provide one hundred percent error free wordline selection.

The invention features an automatic precharge circuit for precharging serial nodes of a driver portion of a row decoder circuit.

The automatic precharge circuit features precharge devices each of which is interposed between a high voltage node, connectable to it supply potential, and a serial node. The precharge devices are gated automatically by a primary predecode signal of a decode portion of the row decoder. Power is conserved since the serial nodes are passively pulled to the supply potential through the precharge devices when automatically gated.

Details of the present invention will become clear from the following detailed description of the invention, taken in conjunction with the accompanying drawings.

DETAILED DESCRIPTION OF THE INVENTION

Figure 1:
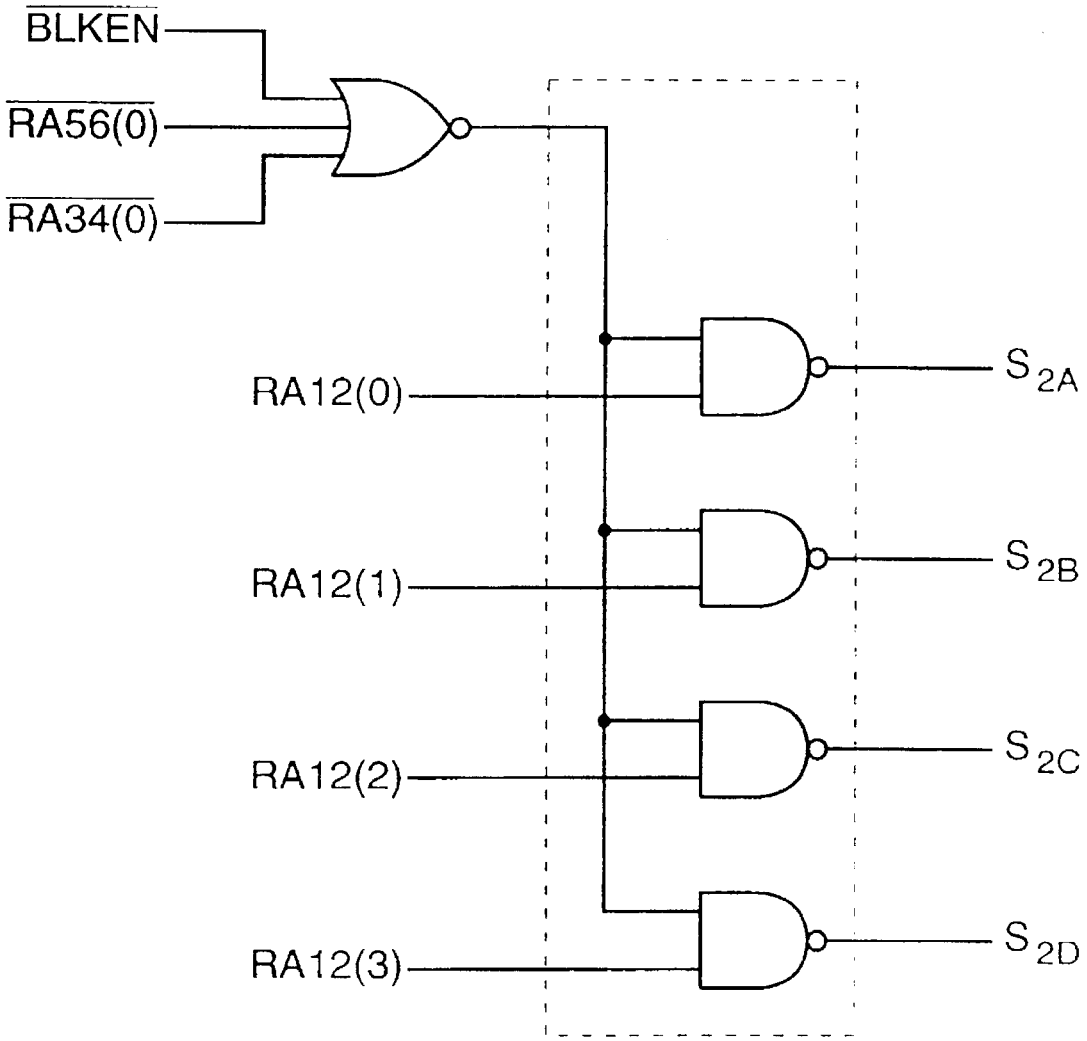
FIG. 1 (RELATED ART)
FIG. 1 is a schematic of a portion of a MOS NAND decoder for row decoder circuitry.
Figure 2:
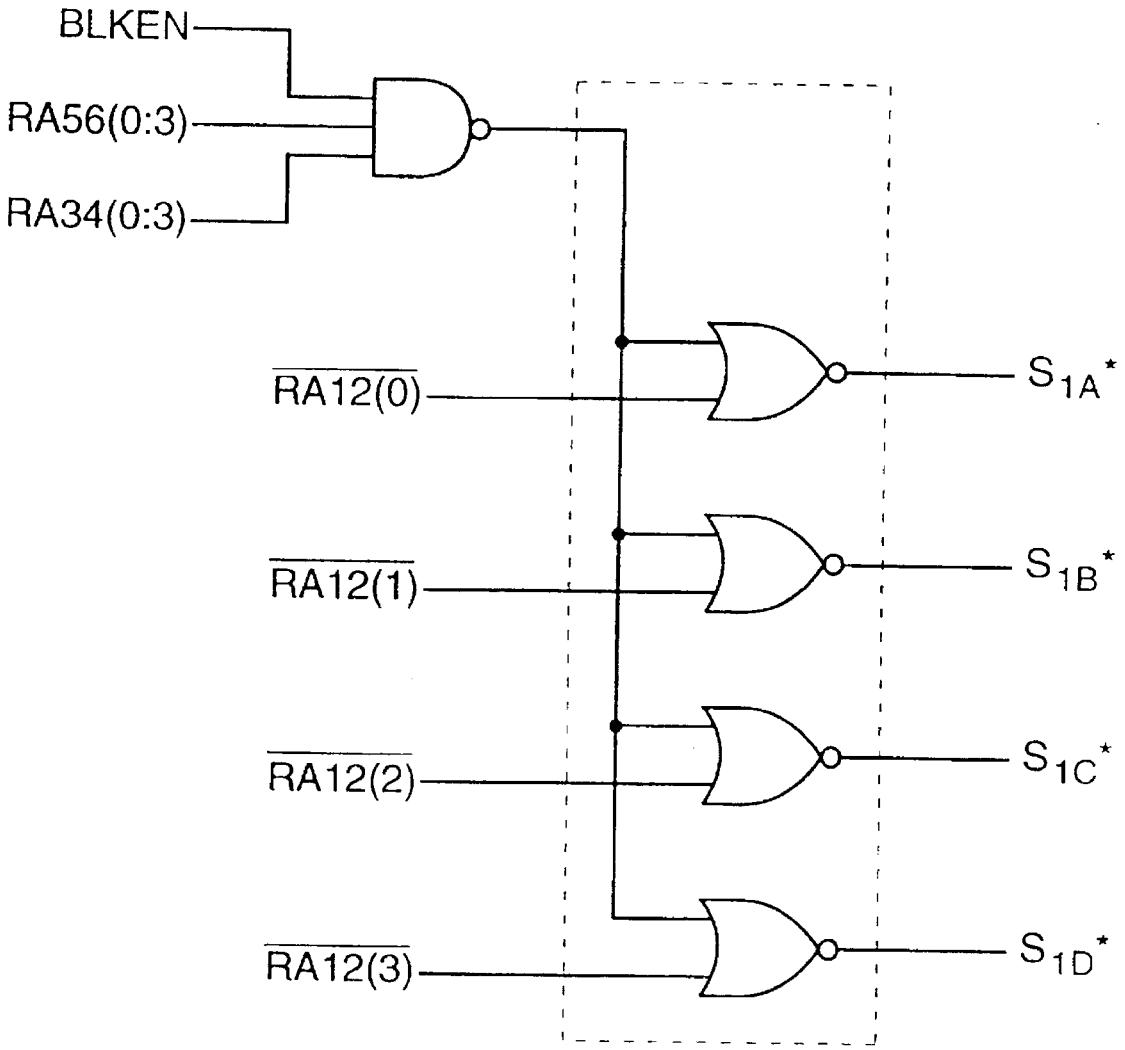
FIG. 2 (RELATED ART)
FIG. 2 is a schematic of a portion of a MOS NOR decoder for row decoder circuitry.
Figure 3:
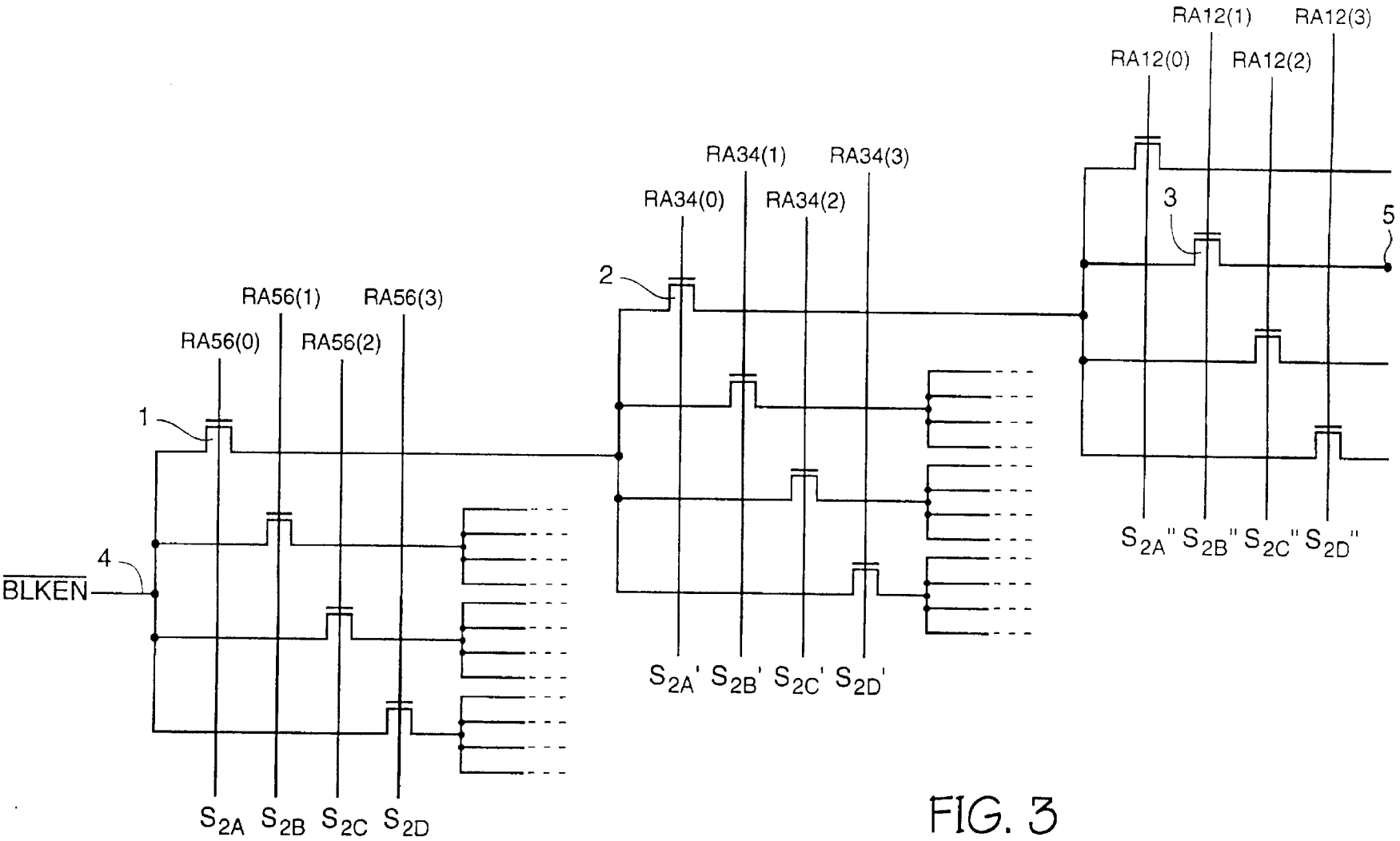
FIG. 3 (RELATED ART)
FIG. 3 is a schematic of a portion of a tree decoder for row decoder circuitry.
Figure 4:
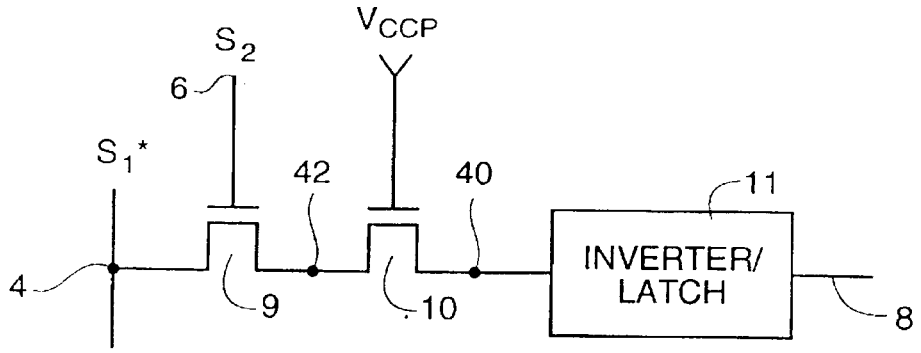
FIG. 4 (RELATED ART)
FIG. 4 is a schematic of a driver circuit of a row decoder of the related art.
Figure 5:
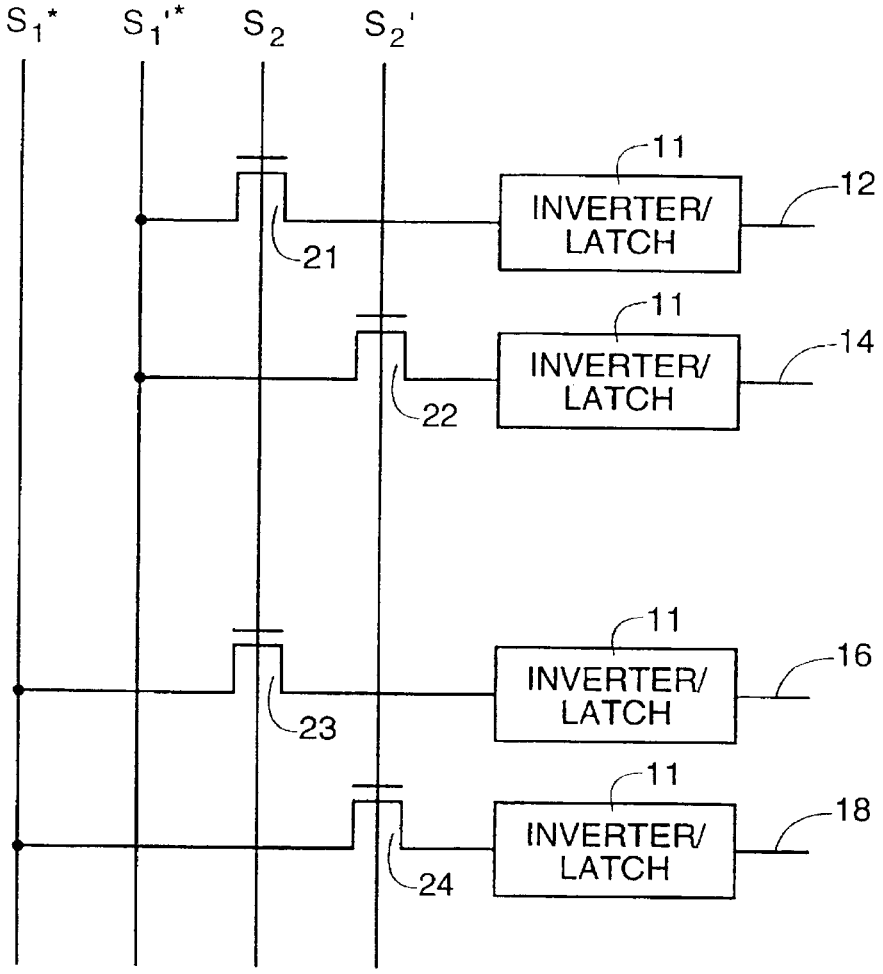
FIG. 5 (RELATED ART)
FIG. 5 is a portion of a row decoder circuit for providing a simplified example of wordline selection.
Figure 6:
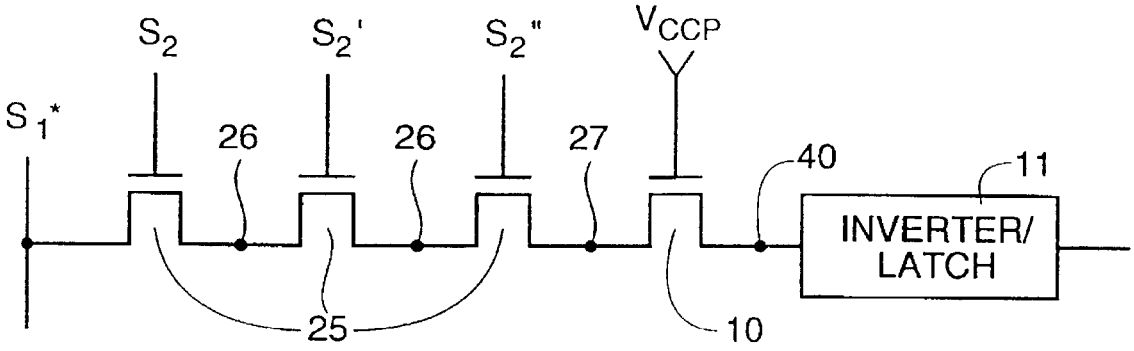
FIG. 6 (RELATED ART)
FIG. 6 is a schematic of a driver circuit of a row decoder of the related art.
Figure 7:
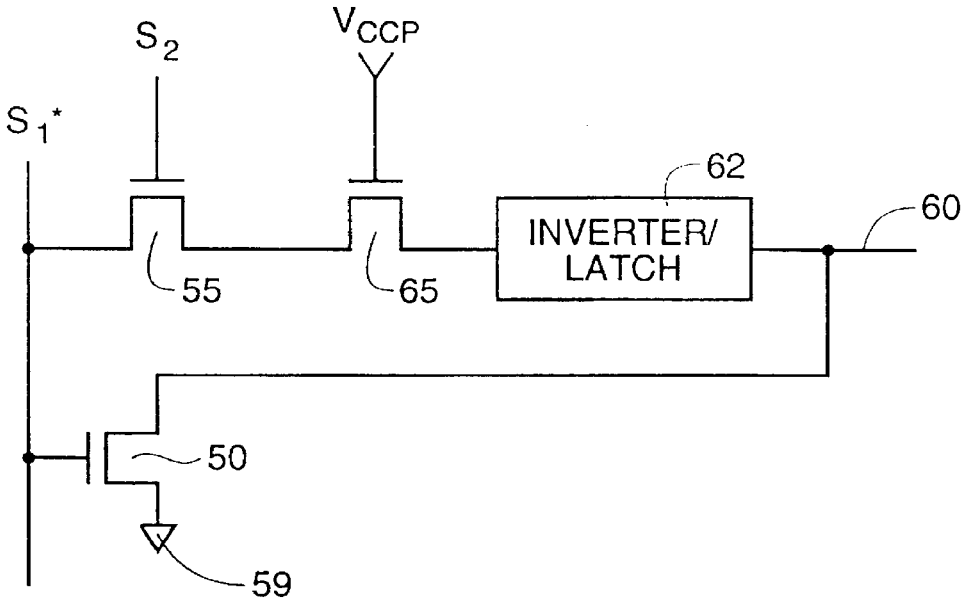
FIG. 7 is a simplified schematic of a driver circuit of the invention.

FIG. 7 represents a driver portion of a row decoder. A decode portion of the row decoder is not shown. The decode portion generates predecode signals $S_1$* and $S_2$. $S_1$* is a primary select signal and controls the actuation and deactuation of pull-down NMOS transistor 50. $S_2$ is a secondary select signal and controls the actuation and deactuation of pass NMOS transistor 55. When a high primary select signal actuates pull-down transistor 50, a low reference potential at reference node 59 is rapidly driven to the wordline 60 through the pull-down transistor 50. Since the high primary select signal is not driven through a pass transistor to the inverter/latch portion 62 and then inverted to the wordline, but instead directly drives the transistor that pulls the wordline low, there is a significant time savings realized over the circuit of the related art is shown in FIG. 4.

In a case where wordline 60 is selected the primary select signal $S_1$* goes to a low potential and the secondary select signal goes to a high potential. The low is then driven through transistors 53 and 65 to the input of inverter/latch 62 where the primary select signal is inverted and driven is a high potential to the wordline 60. The low primary select signal deactuates transistor 50 thereby isolating wordline 60 from the reference potential.

In the case where the primary select signal goes to a low potential but wordline 60 is not selected, the secondary select signal remains low, and the wordline is latched to its initial low potential by inverter/latch circuitry 62.

Figure 8:
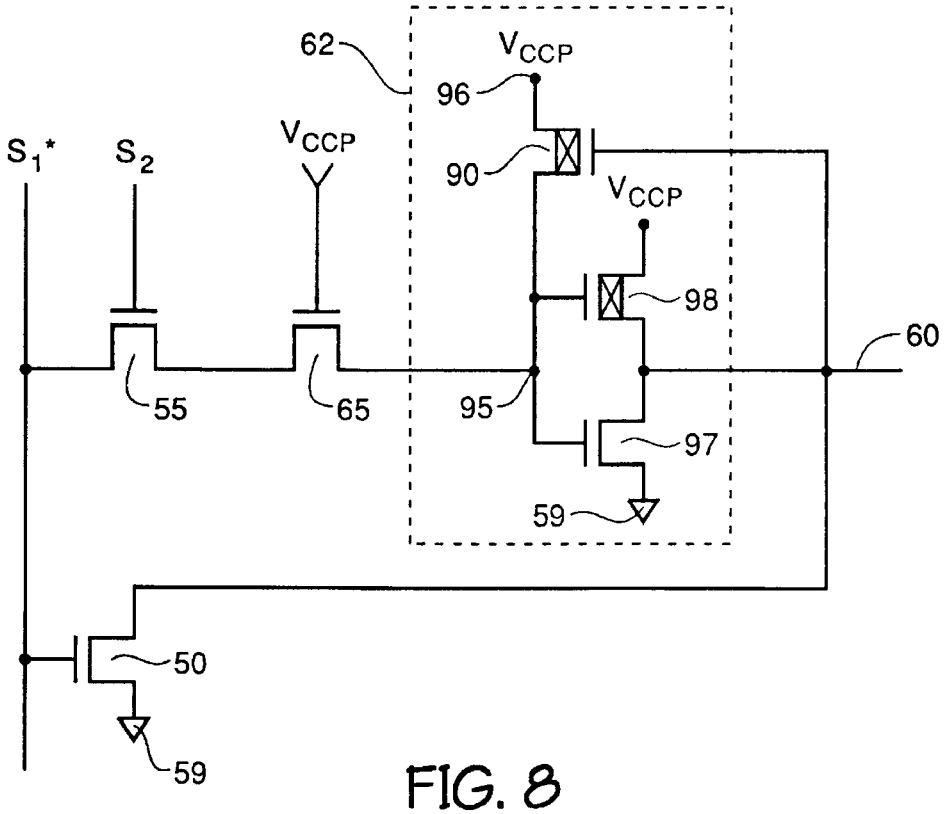
FIG. 8 is a detailed schematic of the driver circuit of the invention.

FIG. 8 is a more detailed schematic of the circuit of FIG. 7. A high primary select signal, $S_1$*, gates transistor 50 rapidly pulling the wordline 60 to a low potential. The low on wordline 60 activates transistor 90 thereby pulling the gate node 95 to the high supply potential at high voltage node 96. This high supply potential at gate node 95 is actually a latch signal. The latch signal actuates transistor 97 which in turn pulls wordline 60 to the reference potential. Thus even if the primary select signal transitions low thereby deactuating transistor 50, the initial low potential on the inactive wordline is latched to the wordline by the inverter/latch circuitry, as long as transistor 55 remains deactuated.

In a case where wordline 60 is selected the primary select signal, $S_1$*, transitions low and the secondary select signal, $S_2$, transitions high. The low primary select signal is then transmitted to node 95 through transistors 55 and 65. The low at 95 actuates transistor 98 and deactuates transistor 97 thereby pulling the wordline to a high supply potential and isolating the wordline from the reference potential.

In the circuit of FIG. 8 transistor 50 is relatively large when compared to transistor 97. Directly driving the wordline to the low potential through transistor 50 ensures the that the wordline is driven to the low potential quickly in the case where the supply potential is lower than the typical 5 volts. This is accomplished without the use of complicated PMOS circuitry and the more cumbersome layout methods necessitated in the manufacture of PMOS-NMOS circuits.

Continually gated NMOS transistor 65 is utilized to prevent the n-well of transistor 90 from forward biasing during powerup when $V_{ccp}$ is less than $V_{cc}$.

Figure 9:
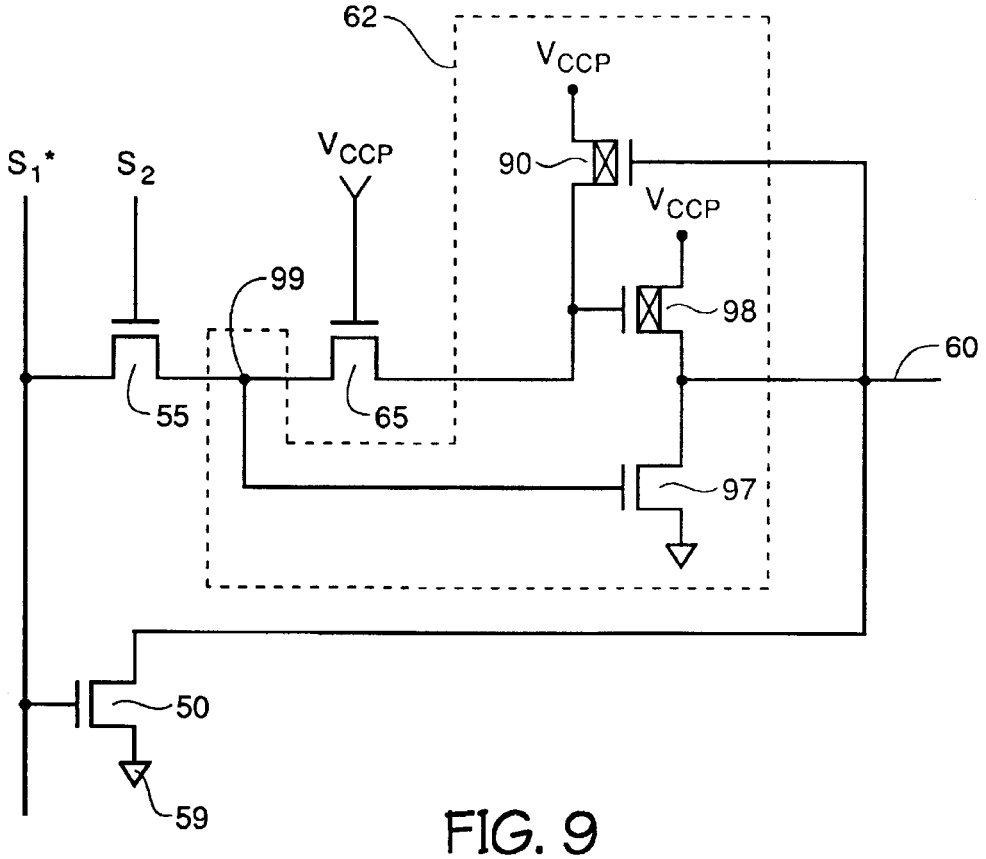
FIG. 9 is a detailed schematic of a further embodiment of the invention.

FIG. 9 is an alternate embodiment of the circuit of FIG. 8. In FIG. 9 the gate node 99 of transistor 97 is the serial connection of transistors 55 and 65. Both placements of nodes 95 and 99, as shown in FIGS. 8 and 9, are equally viable and the final configuration may well be determined from a manufacturing standpoint where layout design restrictions are weighted against circuit performance.

Figure 10:
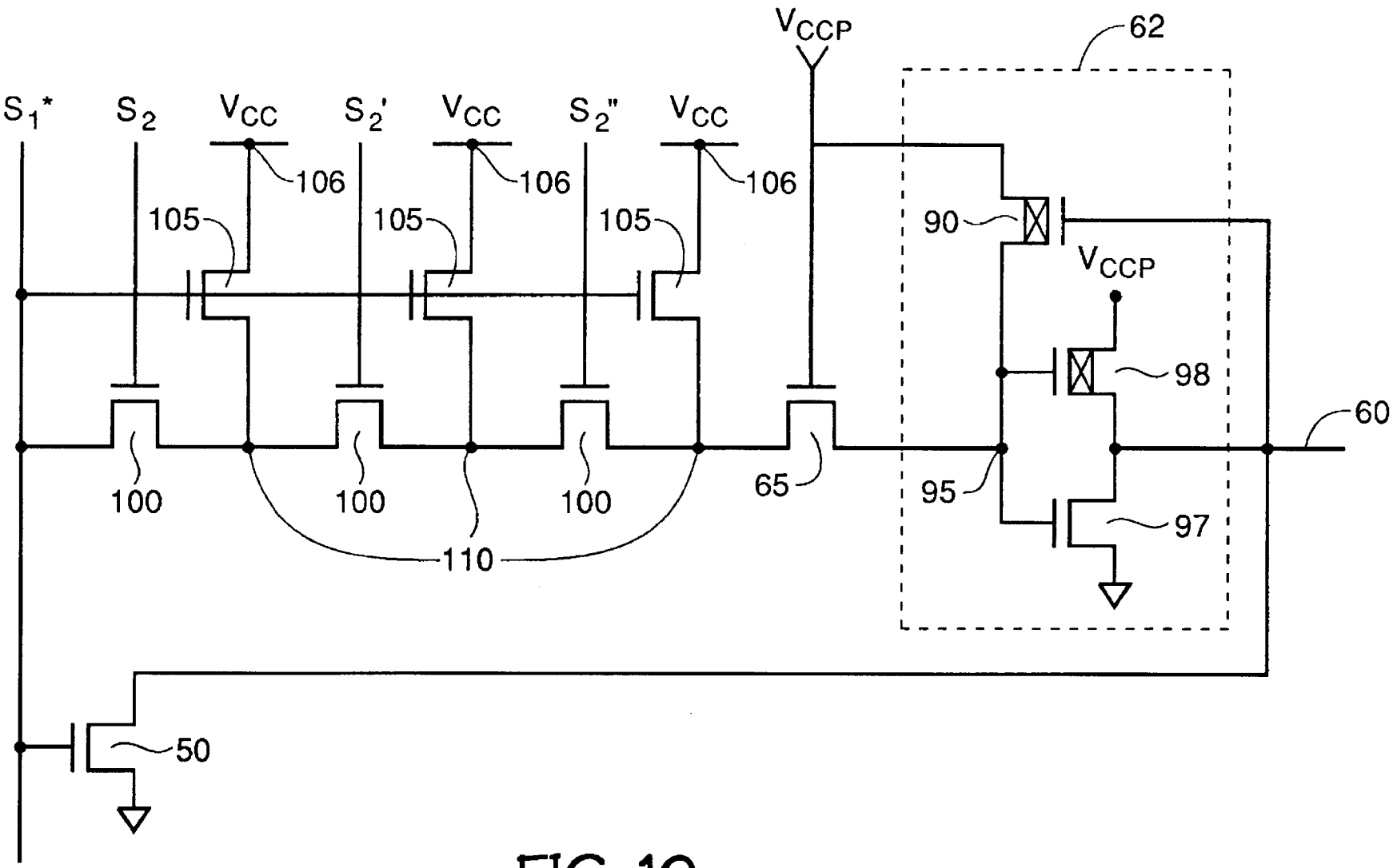
FIG. 10 is a detailed schematic of a further embodiment of the invention.

In FIG. 10 a tree decode is implemented as the decode portion of the row decoder. The circuit of FIG. 8 performs similar to the circuits of FIGS. 9 and 10. When the primary select signal $S_1$* is high transistor 50 is actuated and wordline 60 is pulled to the low reference potential. When the primary select signal transistors low the wordline is latched low by the inverter/latch circuit 62 in a case where the wordline is not selected. In this case at least one of the pass transistors 100 is deactuated. When wordline 60 is selected the secondary select signals $S_2$, $S_2$', and $S_2$" transistiors high thereby actuating pass transistors 100. The low primary select signal is then transmitted to node 95 and the primary select signal then actuates transistor 98 thereby pulling the wordline to the high supply potential. Transistors 50 and 97 are deactuated by the low primary select signal.

Serial nodes 110 provide the electrical connection between the pass transistors and between one of the pass transistors and the continually gated transistor 65. The automatic precharge circuit of the invention eliminates the need for the precharge circuit of the related art. The automatic precharge circuit of the invention provides quick response and large power saving without increasing cell size. The precharge circuit of the invention comprises the serial node pull-up transistors 105. Each serial node pull-up transistor 105 is interposed between high voltage node 106 connected to a supply potential, and a serial node 110. The serial node pull-up transistors are gated by a high primary select signal. Therefore when the primary select signal is high the serial node pull-up transistors are automatically actuated thereby automatically precharging the serial nodes by pulling them passively to the high potential.

When using the present invention the pass transistors 100 do not have to be actuated at the start of each cycle in order to precharge the nodes. A significant power savings is realized using the implementation of the invention over the previous implementation of the related art wherein all of the pass transistors were actuated before each cycle. Since the precharge occurs automatically the access speed is increased. The serial node pull up transistors are fabricated with existing silicon and there is no increase in cell size.

The automatic precharge circuit of the invention can also be utilized in a case wherein a MOS decode has been utilized. In this case the automatic precharge circuit is particularly useful during power up.

It can be seen that the invention quickly drives a non-selected wordline to an inactive logic state having a low potential through the pull-down transistor gated directly by the primary select signal. The low potential is latched to the wordline through an inverter/latch circuit which also drives the wordline to the low potential. The inverter/latch circuit drives a selected wordline high in response to a low primary select signal. Serial node charging transistors can be configured to automatically charge the serial nodes when the primary select signal is high thereby cons power by eliminating the necessity of actuating all of the pass transistors for every wordline at the beginning of each cycle.

Although the invention has been described in terms of an automatic precharge circuit and method for charging the serial nodes of a wordline driver circuit, the circuit and method have utility in other circuits where an automatic precharge is desired. Modification to the circuitry may also be implemented without detracting from the concept of the invention. Accordingly, the invention should be read as limited only by the claims.

What is claimed is:

1. A circuit for selecting a wordline, comprising:

a) a decode means for generating a primary select signal and a secondary select signal, having active and inactive states, in response to an address, said primary and secondary select signals determining selected and non-selected wordlines;

b) a driving means for driving said selected and said non-selected wordlines to active and inactive potentials respectively in response to said primary and secondary select signals, said driving means having a pass device activated by said secondary select signal having said active state;

c) a serial node electrically interposed between said pass device and the wordline; and d) an automatic precharge means for charging the serial node to a desired potential, said automatic precharge means actuated by said primary select signal when said primary select signal has a potential which drives said non-selected wordlines to said inactive potential.

2. The circuit as specified in claim 1, wherein said wordline is non-selected in response to said inactive state of said primary select signal.

3. The circuit as specified in claim 1, further comprising a random access memory device having the circuit for selecting a wordline.

4. The circuit as specified in claim 1, further comprising a computer having the circuit for selecting a wordline.

5. A circuit for automatically precharging a serial node, said circuit comprising:

a) an output node in electrical communication with the serial node and capable of being driven to active and inactive potentials;

b) a primary select node for accepting a primary select signal capable of having a first and a second potential and for determining a potential of the output node;

c) a pass device electrically interposed between the serial node and the primary select node;

d) a precharge node connectable to a precharge potential; and e) an automatic precharge device interposed between said precharge node and the serial node, said automatic precharge device having a control input in electrical communication with said primary select node such that when said primary select signal has said first potential said automatic precharge device pulls said serial node toward said precharge potential.

6. The circuit as specified in claim 5, wherein said output node is driven to said inactive potential by said primary select signal having said first potential.

7. The circuit as specified in claim 5, further comprising:

a) a latch node in electrical communication with said serial node;

b) monitoring circuitry in electrical communication with said latch node, said monitoring circuitry generating a latch signal at said latch node in response to said inactive potential being on said output node; and c) latch circuitry in electrical communication with said output node, said latch circuitry latching said inactive potential to said output node in response to said latch signal.

8. A circuit for selecting an active and an inactive wordline at a direction of a primary select signal and a secondary select signal, comprising:

a) a primary select node for accepting said primary select signal;

b) a pass device electrically interposed between said wordline and said primary select node, said pass device having a control input, an actuation and a deactuation of said pass device controlled by said secondary select signal at said control input;

c) a serial node electrically interposed between said pass device and said wordline;

d) a precharge node connectable to a precharge potential; and e) an automatic precharge device interposed between said precharge node and said serial node, said automatic precharge device having a control input in electrical communication with said primary select node, said automatic precharge device actuated in response to said primary select signal when said primary select signal has a value necessary to inactivate said wordline.

*9. A circuit for selecting a wordline, comprising:*

*a) decode means for generating a primary select signal and a secondary select signal, having active and inactive states, in response to an address, said primary and secondary select signals determining selected and non-selected wordlines;*

*b) driving means for driving said selected and said non-selected wordlines to active and inactive potentials respectively in response to said primary and secondary select signals, said driving means having a pass device activated by said secondary select signal having said active state;*

*c) a node electrically interposed intermediate said pass device and the wordline; and*

*d) an automatic precharge means for charging the intermediate node to a desired potential, said automatic precharge means actuated by said primary select signal when said primary select signal has a potential which drives said non-selected wordlines to said inactive potential.*

*10. The circuit as specified in claim 9, wherein said wordline is non-selected in response to said inactive state of said primary select signal.*

*11. The circuit as specified in claim 9, further comprising a random access memory device having the circuit for selecting a wordline.*

*12. The circuit as specified in claim 9, further comprising a computer having the circuit for selecting a wordline.*

*13. A circuit for automatically precharging a node disposed intermediate a pass device and a wordline, said circuit comprising:*

*a) an output node in electrical communication with the intermediate node and capable of being driven to active and inactive potentials;*

*b) a primary select node for accepting a primary select signal capable of having a first and a second potential and for determining a potential of the output node;*

*c) a pass device electrically interposed between the intermediate node and the primary select node;*

*d) a precharge node connectable to a precharge potential; and*

*e) an automatic precharge device interposed between said precharge node and the intermediate node, said automatic precharge device having a control input in electrical communication with said primary select node such that when said primary select signal has said first potential said automatic precharge device pulls said intermediate node toward said precharge potential.*

*14. The circuit as specified in claim 13, wherein said output node is driven to said inactive potential by said primary select signal having said first potential.*

*15. The circuit as specified in claim 13, further comprising:*

*a) a latch node in electrical communication with said intermediate node;*

*b) monitoring circuitry in electrical communication with said latch node, said monitoring circuitry generating a latch signal at said latch node in response to said inactive potential being on said output node; and*

*c) latch circuitry in electrical communication with said output node, said latch circuitry latching said inactive potential to said output node in response to said latch signal.*

*16. A circuit for selecting an active or an inactive wordline at a direction of a primary select signal and a secondary select signal, comprising:*

*a) a primary select node for accepting said primary select signal;*

*b) a pass device electrically interposed between said wordline and said primary select node, actuation and deactuation of said pass device controlled by said secondary select signal;*

*c) a node electrically interposed intermediate said pass device and said wordline;*

*d) a precharge node connectable to a precharge potential; and*

*e) a precharge control device interposed between said precharge node and said intermediate node, said precharge control device having a control input in electrical communication with said primary select node, said precharge control device actuated to charge said intermediate node from said precharge potential in response to said primary select signal when said primary select signal has a value necessary to inactivate said wordline.*

*17. A circuit for selecting a wordline, comprising:*

*a) decode circuitry for generating a primary select signal and a secondary select signal determining selection and non-selection of said wordline in response to an address, each of said signals having an active state and an inactive state;*

*b) circuitry for driving said wordline to an active or an inactive potential when respectively selected or non-selected in response to said primary and secondary select signals, said driving circuitry including a pass device activated by said secondary select signal having said active state;*

*c) a node electrically interposed intermediate said pass device and said wordline; and*

*d) a precharge circuit for charging the intermediate node to a desired potential, said precharge circuit actuated by said primary select signal when said primary select signal has a potential which drives said wordline when non-selected to said inactive potential.*

*18. The circuit as specified in claim 17, wherein said wordline may be non-selected in response to said inactive state of said primary select signal.*

*19. The circuit as specified in claim 17, further comprising a random access memory device including the circuit for selecting a wordline.*

*20. The circuit as specified in claim 17, further comprising a computer including the circuit for selecting a wordline.*

*21. A circuit for precharging an intermediate node, said circuit comprising:*

*a) an output node in electrical communication with the intermediate node and capable of being driven to active and inactive potentials;*

*b) a primary select node for accepting a primary select signal capable of having a first and a second potential and for determining a potential of the output node;*

*c) a pass device electrically interposed between the intermediate node and the primary select node;*

*d) a precharge node connectable to a precharge potential; and*

*e) a precharge initiation device interposed between said precharge node and the intermediate node, said precharge initiation device having a control input in electrical communication with said primary select node such that when said primary select signal has said first potential said precharge initiation device pulls said intermediate node toward said precharge potential.*

*22. The circuit as specified in claim 21, wherein said output node is driven to said inactive potential by said primary select signal having said first potential.*

*23. The circuit as specified in claim 21, further comprising:*

*a) a gate node in electrical communication with said intermediate node;*

*b) monitoring circuitry in electrical communication with said gate node, said monitoring circuitry generating a latch signal at said gate node in response to said inactive potential being on said output node; and*

*c) latch circuitry in electrical communication with said output node, said latch circuitry latching said inactive potential to said output node in response to said latch signal.*

*24. A circuit for selecting an active or an inactive wordline responsive to a primary select signal and a secondary select signal, comprising:*

*a) a primary select node for accepting said primary select signal;*

*b) a pass device electrically interposed between said wordline and said primary select node, actuation and deactuation of said pass device controllable by said secondary select signal;*

*c) a node electrically interposed intermediate said pass device and said wordline;*

*d) a precharge node connectable to a precharge potential; and*

*e) a precharge control device interposed between said precharge node and said intermediate node and in electrical communication with said primary select node, said precharge control device actuated in response to said primary select signal when said primary select signal has a value necessary to inactivate said wordline.*

*25. A circuit for selecting a wordline, comprising:*

*decode circuitry for generating a primary select signal and a secondary select signal for selection and non-selection of said wordline in response to an address, each of said signals having an active state and an inactive state;*

*driver circuitry for taking said wordline to an active or an inactive potential in response to said primary and secondary select signals, said driver circuitry including a pass device activated by said secondary select signal having said active state;*

*a node electrically interposed intermediate said pass device and said wordline; and*

*a precharge circuit for charging the intermediate node to a desired potential, said precharge circuit actuated by said primary select signal when said primary select signal has a potential which takes said wordline when non-selected to said inactive potential.*

*26. The circuit as specified in claim 25, wherein said wordline may be non-selected in response to said inactive state of said primary select signal.*

*27. The circuit as specified in claim 25, further comprising a random access memory device including the circuit for selecting a wordline.*

*28. The circuit as specified in claim 25 further comprising a computer including the circuit for selecting a wordline.*

*29. A circuit adapted to precharge an intermediate node of a driver portion of a row decoder, said circuit comprising:*

*an output capable of being driven to active and inactive potentials;*

*a primary select input for accepting a primary select signal of a first potential and a second potential for determining a potential of the output;*

*a pass device interposed between the intermediate node and the primary select input;*

*a precharge potential source; and*

*a precharge initiation device interposed between said precharge potential source and the intermediate node, said precharge initiation device controllable responsive to a primary select signal accepted by said primary select input such that when said primary select signal has said first potential said precharge initiation device pulls said intermediate node toward said precharge potential.*

*30. The circuit as specified in claim 29, wherein said output is taken to said inactive potential by said primary select signal having said first potential.*

*31. The circuit as specified in claim 29, further comprising:*

*monitoring circuitry for generating a latch signal in response to said inactive potential being on said output node; and*

*latch circuitry for latching said inactive potential to said output node in response to said latch signal.*

*32. A circuit for selecting an active or an inactive wordline responsive to a primary select signal and a secondary select signal, comprising:*

*a primary select input for accepting said primary select signal;*

*a pass device controlled by said secondary select signal interposed between said wordline and said primary select input;*

*a node interposed intermediate said pass device and said wordline;*

*a precharge potential source; and*

*a precharge control device interposed between said precharge potential source and said intermediate node and in communication with said primary select input, said precharge control device actuated in response to a primary select signal of a value necessary to inactivate said wordline.*

*33. A circuit for selecting an active or an inactive wordline responsive to a primary select signal and a secondary select signal, comprising:*

*a primary select input for accepting said primary select signal;*

*a decode device controlled by said secondary select signal interposed between said wordline and said primary select input;*

*a node interposed intermediate said decode device and said wordline;*

*a precharge potential source; and*

*a precharge control device interposed between said precharge potential source and said intermediate node and in communication with said primary select input, said precharge control device actuated in response to a primary select signal of a value necessary to inactivate said wordline.*

*34. A circuit for selecting an active or an inactive wordline responsive to a primary select signal and a secondary select signal, comprising:*

*a primary select input for accepting said primary select signal;*

*select circuitry controlled by said secondary select signal interposed between said wordline and said primary select input;*

*a node interposed intermediate said select circuitry and said wordline;*

*a precharge potential source; and*

*a precharge control device interposed between said precharge potential source and said intermediate node and in communication with said primary select input, said precharge control device actuated in response to a primary select signal of a value necessary to inactivate said wordline.*

* * * * *

UNITED STATES PATENT AND TRADEMARK OFFICE

CERTIFICATE OF CORRECTION

PATENT NO. : RE 35,750

DATED : March 24, 1998

INVENTOR(S) : Casper et al.

It is certified that error appears in the above-identified patent and that said Letters Patent is hereby corrected as shown below:

Column 1, line 64, please insert --is-- after "wordline".

Column 4, line 20, please delete the semicolon ";" after "regardless".

Column 4, line 39, please delete "it " and insert --a--.

Column 5, line 25, please delete "53" and insert --55--.

Column 5, line 26, please delete "is a" and insert --as--.

Column 6, line 11, please delete "transistors" and insert --transitions--.

Column 6, lines 15 and 16, please delete "transistors" and insert --transitions--.

Column 6, line 60, please delete "cons" and insert --conserving--.

Signed and Sealed this

Twelfth Day of January, 1999

*Attest:*

*Attesting Officer*

*Acting Commissioner of Patents and Trademarks*